(12) United States Patent
Fortin-Blanchette et al.

(10) Patent No.: US 11,553,595 B2
(45) Date of Patent: Jan. 10, 2023

(54) PRINTED CIRCUIT BOARD COMPRISING A PLURALITY OF POWER TRANSISTOR SWITCHING CELLS IN PARALLEL

(71) Applicant: IDÉNERGIE INC., Montreal (CA)

(72) Inventors: Handy Fortin-Blanchette, Montreal (CA); Pierre Blanchet, Montreal (CA)

(73) Assignee: IDÉNERGIE INC., Montreal (CA)

( * ) Notice: Subject to any disclaimer, the term of this patent is extended or adjusted under 35 U.S.C. 154(b) by 48 days.

(21) Appl. No.: 17/326,407

(22) Filed: May 21, 2021

(65) Prior Publication Data

US 2022/0377898 A1 Nov. 24, 2022

(51) Int. Cl.
| | |
|---|---|
| *H05K 1/11* | (2006.01) |
| *H05K 1/18* | (2006.01) |
| *H05K 1/02* | (2006.01) |

(52) U.S. Cl.
CPC ........... *H05K 1/181* (2013.01); *H05K 1/0204* (2013.01); *H05K 1/11* (2013.01); *H05K 2201/066* (2013.01); *H05K 2201/10166* (2013.01); *H05K 2201/10409* (2013.01)

(58) Field of Classification Search
CPC ....................... H05K 1/11; H05K 2201/10166
See application file for complete search history.

(56) References Cited

U.S. PATENT DOCUMENTS

| | | | | |
|---|---|---|---|---|
| 5,119,286 A | * | 6/1992 | Huss .................... | H05K 1/0265 361/736 |
| 5,731,970 A | * | 3/1998 | Mori ...................... | H01L 24/49 363/43 |
| 2015/0207429 A1 | * | 7/2015 | Akiyama ................ | H01L 24/49 363/131 |
| 2015/0236686 A1 | * | 8/2015 | Senda .................... | H03K 17/60 327/381 |
| 2018/0056795 A1 | * | 3/2018 | Xu ........................ | H03K 17/567 |

* cited by examiner

*Primary Examiner* — Sherman Ng
(74) *Attorney, Agent, or Firm* — IP Delta Plus Inc.

(57) ABSTRACT

A printed circuit board comprises N power switching cells operating in parallel and respectively comprising a transistor leg, at least one decoupling capacitor and a gate driver circuit. Each transistor leg comprises respective first and second transistors in series, a drain of the first transistor being connected to a positive DC line, a source of the second transistor being connected to a negative DC line, a source of the first transistor being connected to a drain of the second through a connection middle-point connected to an output terminal. Each gate driver circuit controls respective switching ON and OFF of the corresponding first and second transistors. The N transistor legs of the corresponding N power switching cells are positioned to substantially form a convex polygon having N edges of substantially the same length, each one of the N transistor legs being positioned along one of the edges of the convex polygon.

20 Claims, 9 Drawing Sheets

Prior Art

Figure 1

Prior Art

Prior Art

United States Patent US 11,553,595 B2

PRINTED CIRCUIT BOARD COMPRISING A PLURALITY OF POWER TRANSISTOR SWITCHING CELLS IN PARALLEL

TECHNICAL FIELD

The present disclosure relates to the field of power electronic modules. More specifically, the present disclosure relates to a printed circuit board comprising a plurality of power transistor switching cells in parallel.

BACKGROUND

Power electronic modules have multiple applications, for example in power conversion equipment such as industrial motor drives, embedded motor drives, uninterruptible power supplies, etc. Power electronic modules are also used in inverters for renewable energies as wind turbines, photovoltaic panels and electric vehicles (EVs). A power electronic module comprises various types of electric and electronic components, including transistors.

Transistors used in power electronic modules are usually referred to as power transistors. A power transistor has specific characteristics, such as a housing capable of supporting important instantaneous power dissipation and high voltage and current which makes the power transistor suitable for being used in an electronic power module.

A common electronic design consists in using several power transistors in parallel. For example, it is common to find packages available on the market which encapsulate fast power transistors connected in parallel. In this configuration, it is difficult to ensure a uniform distribution of electrical currents in dynamic conditions, more specifically during the switching periods of the transistors. Electrical current disparities during the switching transient results in higher switching losses for the transistors absorbing higher electrical currents. These switching losses cause additional heating in these transistors, altering their long-term reliability.

This problem is strongly accentuated for transistors with fast switching capabilities, such as Gallium Nitride (GaN) and Silicon Carbide Metal-Oxide-Semiconductor (SiC-MOS) transistors. When multiple transistors are placed in parallel, the switching performance of the set of transistors is strongly affected by the presence of unequal parasitic elements for each transistor, more specifically parasitic leakage inductance.

Considering a transistor designed and manufactured by a given manufacturer, the transistor already integrates (at die level) many transistor cells in parallel, to achieve a given electrical current capacity for the transistor. Since the surface covered by these multiple cells in parallel is very small, electrical current sharing is well controlled at the transistor level. However, when several of these transistors are used in parallel, it is difficult to avoid the aforementioned issues occurring during the switching periods of the parallel transistors. This is due to the fact that the internal cells of each respective transistor are separated by the external connectivity of the transistors (e.g. pins, printed circuit traces, etc.) and the influence of this external connectivity on electrical current sharing is not easy to predict if it is not well designed.

Therefore, there is a need for a new printed circuit board comprising a plurality of power transistor switching cells in parallel.

SUMMARY

According to a first aspect, the present disclosure relates to a printed circuit board. The printed circuit board comprises a pair of input terminals consisting of a positive direct current (DC) terminal and a negative DC terminal. The printed circuit board also comprises an output terminal, a positive DC line connected to the positive DC terminal and a negative DC line connected to the negative DC terminal. The printed circuit board further comprises N power switching cells, N being an integer greater than two, the N power switching cells operating in parallel. Each power switching cell comprises a transistor leg, at least one decoupling capacitor in parallel with the transistor leg, and a gate driver circuit. The transistor leg comprises a first transistor and a second transistor connected in series, a drain of the first transistor being connected to the positive DC line, a source of the second transistor being connected to the negative DC line, a source of the first transistor being connected to a drain of the second transistor via an electrical line comprising a connection middle-point, the connection middle-point being connected to the output terminal. The gate driver circuit comprises a first gate driver electrically connected to a gate of the first transistor and a second gate driver electrically connected to a gate of the second transistor for controlling respective switching ON and OFF of the first and second transistors. The N transistor legs of the corresponding N power switching cells are positioned on the printed circuit board to substantially form a convex polygon having N edges of substantially the same length, each one of the N transistor legs of the corresponding N power switching cells being positioned along one of the edges of the convex polygon.

In a particular aspect, the output terminal is positioned substantially at the center of the convex polygon formed by the N transistor legs of the corresponding N power switching cells.

In another particular aspect, the positive and negative DC lines are positioned on the printed circuit board to encircle the N transistor legs of the corresponding N power switching cells.

In still another particular aspect, one of the positive or negative DC lines is stacked above the other one to form a laminated DC bus.

In yet another particular aspect, the at least one decoupling capacitor of the N power switching cells are evenly distributed on the printed circuit board.

In another particular aspect, the first and second transistors consist of power transistors.

BRIEF DESCRIPTION OF THE DRAWINGS

Embodiments of the disclosure will be described by way of example only with reference to the accompanying drawings, in which.

DETAILED DESCRIPTION

The foregoing and other features will become more apparent upon reading of the following non-restrictive description of illustrative embodiments thereof, given by way of example only with reference to the accompanying drawings.

Various aspects of the present disclosure generally address one or more of the problems related to the integration of transistor legs in parallel, where each transistor leg comprises two power transistors in series. For this purpose, a systematic printed circuit board layout design adapted for integrating the transistor legs in parallel is disclosed.

Figure 1:
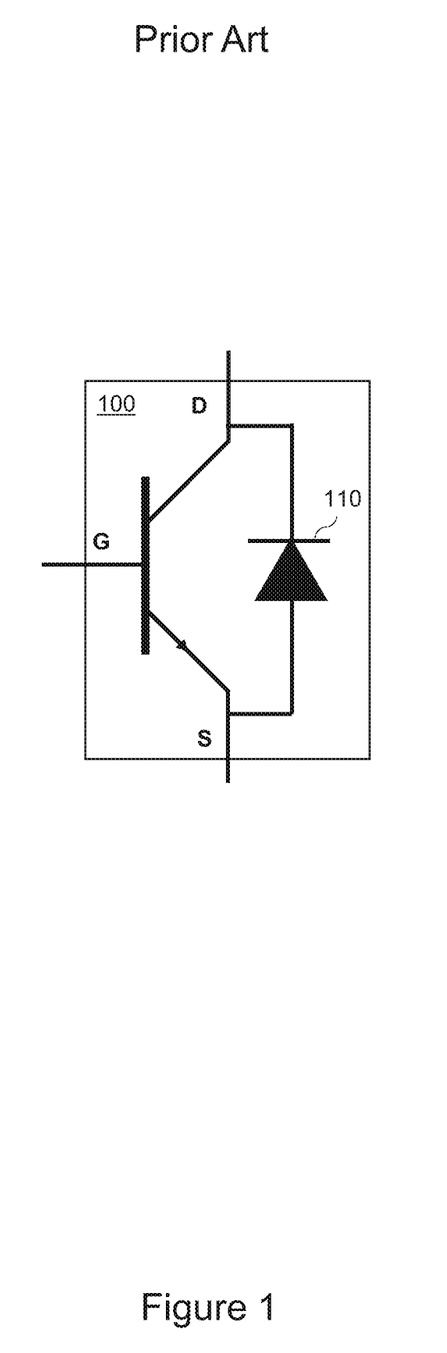
FIG. 1 represents a transistor, as is well known in the art.

Referring to FIG. 1, a power transistor 100 is illustrated. The functionalities of the power transistor 100 are well known in the art. The transistor comprises a gate (G in FIG. 1), a source (S in FIG. 1) and a drain (D in FIG. 1).

Transistors can be used as a switch or an amplifier. The present disclosure aims at using the power transistor 100 as a switch. By applying an electrical voltage higher than a voltage threshold to the gate G, the power transistor 100 is switched ON and an electrical current circulates from the drain D to the source S. If the electrical voltage applied to the gate G reaches a certain amount (a voltage saturation higher than the voltage threshold), the power transistor 100 enters a state referred to as saturation, where the amount of electrical current circulating from the drain D to the source S is constant and no longer depends on the electrical voltage applied to the gate G. Further increasing the electrical voltage applied to the gate G does not increase the amount of electrical current circulating from the drain D to the source S. When the electrical voltage applied to the gate G is lower than the threshold voltage, the power transistor 100 is switched OFF and no electrical current circulates from the drain D to the source S. Thus usually, when using a transistor as a switch, only two amounts of electrical voltage applied to the gate G are used: an electrical voltage below the threshold voltage to switch the transistor OFF, and an electrical voltage above the saturation voltage placing the transistor in saturation mode where the transistor is switched ON.

Power transistors have the additional characteristic of operating with a diode 110. FIG. 1 illustrates a power transistor 100 where the diode 110 is integrated to the transistor, in which case the diode is referred to as an intrinsic body diode. For example, a Metal-oxide Semiconductor Field-effect transistor (MOSFET) transistor is a power transistor with an intrinsic body diode. Alternatively, the diode 110 is not integrated to the power transistor, but is associated to the power transistor and plays the same role as the aforementioned intrinsic body diode. For example, an Insulated Gate Bipolar Transistor (IGBT) transistor is a power transistor without an intrinsic body diode, which is combined with an independent diode (e.g. an epitaxial diode) playing the role of the intrinsic body diode. In the rest of the disclosure, when referring to a power transistor, it will include either a power transistor with an intrinsic body diode or a power transistor operating with an external diode playing the role of the intrinsic body diode.

By design, power transistors have a greater size and generate more heat than other types of transistors. Consequently, their integration to a printed circuit board is more challenging, at least in terms of positioning with respect to other components of the printed circuit board and in terms of cooling.

Figure 2:
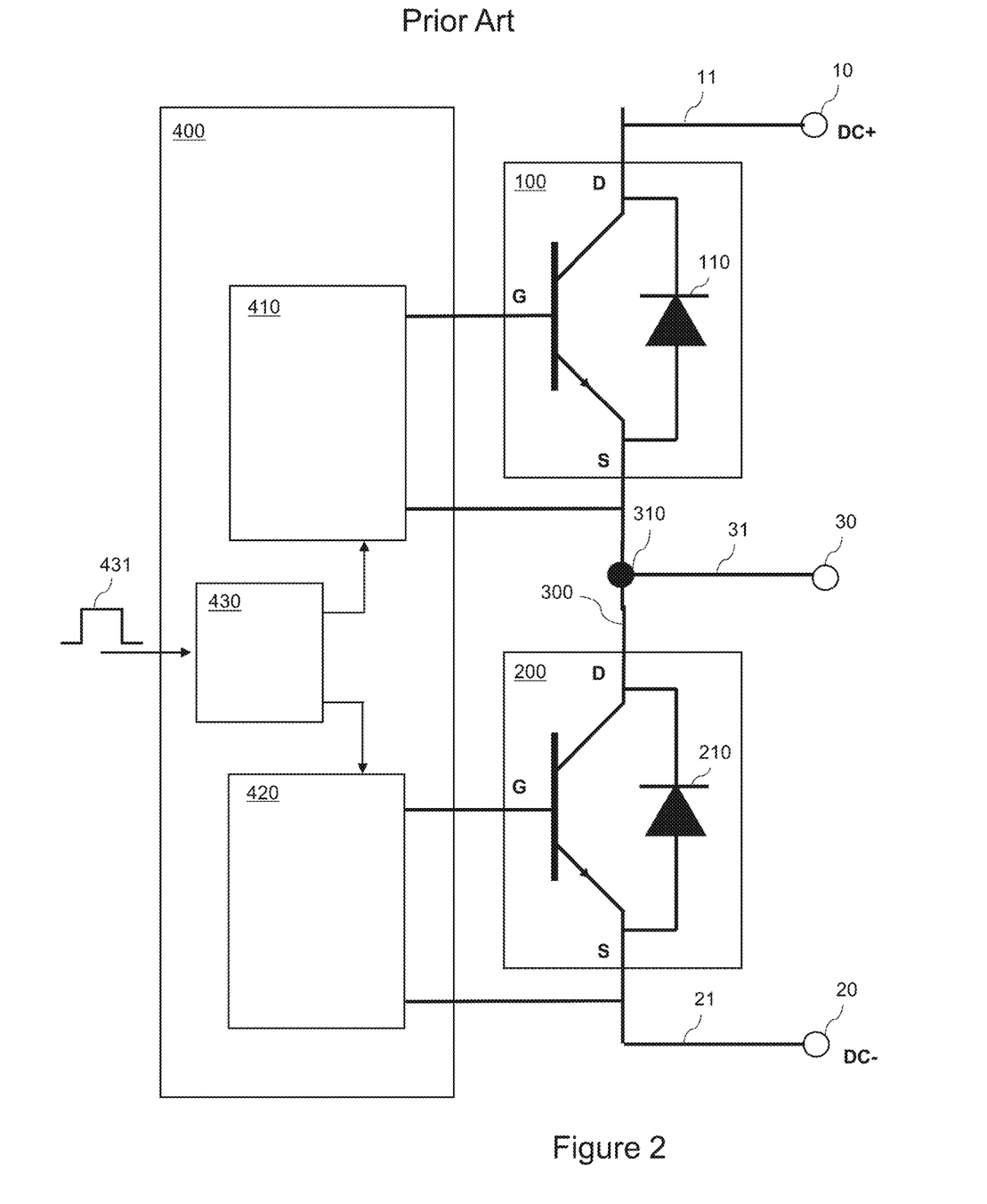
FIG. 2 represents a power switching cell comprising two power transistors in series, as is well known in the art.

Reference is now made concurrently to FIGS. 1 and 2, where FIG. 2 represents a power switching cell comprising two power transistors 100 and 200 in series, as is well known in the art.

The power transistor 100 of FIG. 2 corresponds to the power transistor 100 illustrated in FIG. 1. The power transistor 200 has the same characteristics as the power transistor 100. As mentioned previously, the power transistors 100 and 200 of FIG. 2 are represented with respective intrinsic body diodes 110 and 210. However, the design of the power switching cell of FIG. 2 is applicable to power transistors associated to respective external diodes (e.g. epitaxial diode) playing the role of the intrinsic body diodes.

The drain D of the power transistor 100 is connected to an electrical direct current (DC) terminal 10 via an electrical DC line 11. The terminal 10 receives a positive electrical voltage DC+ from a DC power source not represented in FIG. 2 for simplification purposes. The electrical DC line 11 is referred to as a positive DC line.

The source S of the power transistor 200 is connected to an electrical DC terminal 20 via an electrical DC line 21. The terminal 20 receives a negative electrical voltage DC- from the DC power source. The electrical DC line 21 is referred to as a negative DC line.

The source S of the power transistor 100 is connected to the drain D of the power transistor 200 via a line 300 comprising a connection middle-point 310. The connection middle-point 310 is connected to an output terminal 30 via an output line 31.

A gate driver circuit 400 controls the switching ON and OFF of the power transistors 100 and 200. In the implementation illustrated in FIG. 2, the gate driver circuit 400 comprises a first gate driver 410 controlling the power transistor 100 and a second gate driver 420 controlling the power transistor 200. The gate drivers 410 and 420 are separated from one another (electrically distinct for isolation purposes). However, the gate drivers 410 and 420 are synchronized. When the gate driver 410 switches ON the power transistor 100, then the gate driver 420 switches OFF the power transistor 200. When the gate driver 410 switches OFF the power transistor 100, then the gate driver 420 switches ON the power transistor 200. For example, each gate driver (410, 420) is an optocoupler controlling an electrical voltage applied to the respective gates G of each power transistor (100, 200). A switch control component 430 of the gate driver circuit 400 is in charge of synchronizing the gate drivers 410 and 420. The switch control component 430 is controlled by an electrical control signal 431 generated by an external component (not represented in FIG. 2 for simplification purposes).

When the power transistor 100 is switched ON and the power transistor 200 is switched OFF, the connection middle-point 310 is electrically connected to the positive DC line 11. The electrical voltage at the output terminal 30 is substantially the same as the electrical voltage of the DC+ terminal 10.

When the power transistor 100 is switched OFF and the power transistor 200 is switched ON, the connection middle-point 310 is electrically connected to the negative DC line 21. The electrical voltage at the output terminal 30 is substantially the same as the electrical voltage of the DC− terminal 20.

The switch control component 430 may also be configured (via the electrical control signal 431) to switch the two power transistors 100 and 200 OFF simultaneously. In this case, the circuit including the two power transistors 100 and 200 is in an idle state, where electrical current circulates through the diodes 110 and 210. The electrical voltage at the output terminal 30 depends on the electrical current circulating in an inductive load connected to the output terminal 30.

The switch control component 430 may include an internal protection mechanism, to avoid switching the two power transistors 100 and 200 ON simultaneously (to avoid damaging the circuit including the two power transistors 100 and 200).

A person skilled in the art would readily understand that other implementations of the gate driver circuit 400 (comprising the first 410 and second 420 gate drivers) may be used in the context of the present disclosure.

Figure 3:
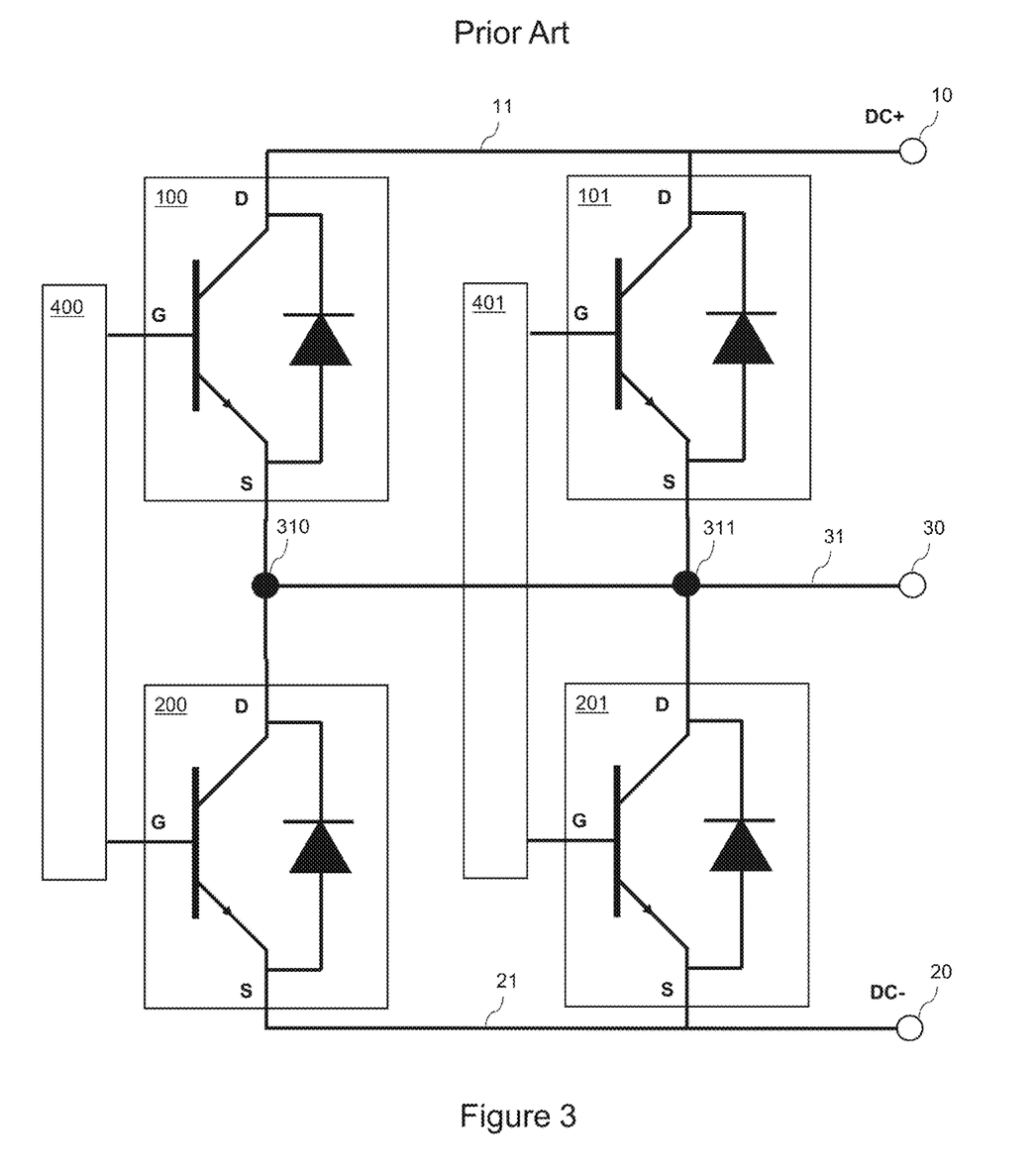
FIG. 3 represents a design for integrating two power switching cells identical to the one illustrated in FIG. 2 in parallel, as is well known in the art.

Reference is now made concurrently to FIGS. 2 and 3, where FIG. 3 represents two power switching cells (identical to the one illustrated in FIG. 2) in parallel, as is well known in the art.

The first power switching cell represented in FIG. 3 corresponds to the power switching cell illustrated in FIG. 2. The second power switching cell illustrated in FIG. 3 comprises a first power transistor 101 corresponding to the power transistor 100, a second power transistor 201 corresponding to the power transistor 200, a gate driver circuit 401 corresponding to the gate driver circuit 400, and a connection middle-point 311 corresponding to the connection middle-point 310.

The respective drains D of the power transistors 100 and 101 are connected to the DC+ terminal 10 via the positive DC line 11. The respective sources S of the power transistors 200 and 201 are connected to the DC− terminal 20 via the negative DC line 21.

The respective connection middle-points 310 (between the power transistors 100 and 200) and 311 (between the power transistors 101 and 201) are connected to the output terminal 30 via the output line 31.

Although not represented in FIG. 3 for simplification purposes, an external component controls and synchronizes the gate driver circuits 400 and 401 (e.g. via respective electrical control signals 431 as illustrated in FIG. 2).

Following is a table showing the states of the power transistors, as driven by the gate driver circuits 400 and 401. As mentioned previously, the power transistors shall never be all switched ON, to avoid damaging the circuit.

TABLE 1

| Transistor 100 | Transistor 200 | Transistor 101 | Transistor 201 | Electrical voltage at output terminal 30 |
| --- | --- | --- | --- | --- |
| ON | OFF | ON | OFF | DC+ |
| OFF | ON | OFF | ON | DC− |
| OFF | OFF | OFF | OFF | Depends on load current sign |

Figure 4:
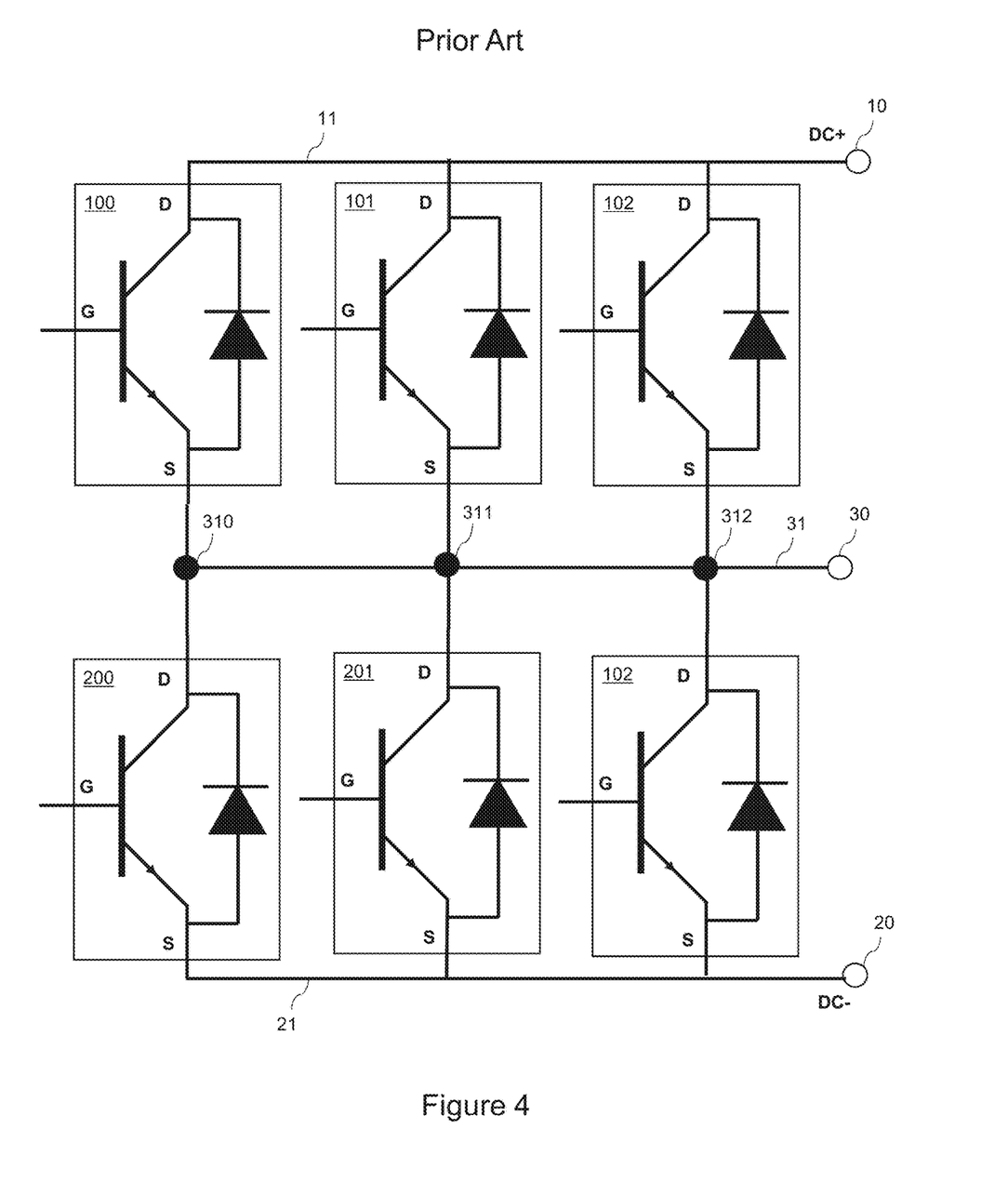
FIG. 4 represents a design for integrating three power switching cells identical to the one illustrated in FIG. 2 in parallel, as is well known in the art.

Reference is now made concurrently to FIGS. 2, 3 and 4, where FIG. 4 represents three power switching cells (identical to the one illustrated in FIG. 2) in parallel, as is well known in the art.

The first and second power switching cells represented in FIG. 4 corresponds to the power switching cells illustrated in FIG. 3. The third power switching cell illustrated in FIG. 4 comprises a first power transistor 102 corresponding to the power transistors 100 and 101, a second power transistor 202 corresponding to the power transistors 200 and 201, and a connection middle-point 312 corresponding to the connection middle-points 310 and 311. The gate driver circuits for controlling and synchronizing the respective first, second and third switching cells are not represented in FIG. 4 for simplification purposes. However, a person skilled in the art would readily adapt the circuit represented in FIG. 4 to include one respective gate driver circuit per switching cell, as illustrated in FIG. 3.

The respective drains D of the power transistors 100, 101 and 102 are connected to the DC+ terminal 10 via the positive DC line 11. The respective sources S of the power transistors 200, 201 and 202 are connected to the DC− terminal 20 via the negative DC line 21.

The respective connection middle-points 310 (of the power transistors 100 and 200), 311 (of the power transistors 101 and 201) and 312 (of the power transistors 102 and 202) are connected to the output terminal 30 via the output line 31.

Following is a table showing the states of the power transistors, as driven by their gate driver circuits (not represented in FIG. 4 for simplification purposes). As mentioned previously, the power transistors shall never be all switched ON, to avoid damaging the circuit.

TABLE 2

| Transistor 100 | Transistor 200 | Transistor 101 | Transistor 201 | Transistor 102 | Transistor 202 | Electrical voltage at output terminal 30 |
| --- | --- | --- | --- | --- | --- | --- |
| ON | OFF | ON | OFF | ON | OFF | DC+ |
| OFF | ON | OFF | ON | OFF | ON | DC− |
| OFF | OFF | OFF | OFF | OFF | OFF | Depends on load current sign |

The number of switching cells which can be put in parallel is an integer N greater (strictly) than 1. FIG. 3 is an exemplary implementation where N equals 2 and FIG. 4 is an exemplary implementation where N equals 3. However, a person skilled in the art may generalize the designs of FIGS. 2, 3 and 4 to N being equal to 4, 5, 6, etc.

At least one of the objectives of putting N switching cells in parallel is to increase the electrical current capacity at the output terminal 30. As is well known in the art, the electrical current capacity at the output terminal 30 increases when N increases.

For each switching cell, the two power transistors in series are referred to as a transistor legs. In FIGS. 3 and 4, the first transistor leg comprises the power transistors 100 and 200, and the second transistor leg comprises the power transistors 101 and 201. In FIG. 4, the third transistor leg comprises the power transistors 102 and 202.

As illustrated in FIGS. 3 and 4, a common design for a circuit comprising a plurality of switching cells in parallel is to align the transistor legs horizontally. For example, a row of transistor legs is assembled on a metallic bar, to ensure a proper heat transfer. The gate driver circuits (e.g. 400 and 401 in FIG. 3) may be positioned in the same layer as the transistor legs as illustrated in FIG. 3, or may not be positioned in the same layer (e.g. stacked above the transistor legs).

In the case of slow switching transistors, such as Insulated Gate Bipolar Transistor (IGBT) transistors, the design consisting in creating a row of transistor legs aligned horizontally does not have a significant impact on the performances of the global circuit comprising all the power transistors.

However, in the case of fast switching transistors, such as Gallium Nitride (GaN) and Silicon Carbide Metal-Oxide-Semiconductor (SiCMOS) transistors, the design consisting in creating a row of transistor legs aligned horizontally has an impact on the performances (and longevity) of the global circuit comprising all the power transistors (due to the aforementioned issues of parasitic leakage inductance).

The present disclosure aims at providing a new design for a circuit combining a plurality of switching cells in parallel, by providing an optimized placement of the corresponding parallel transistor legs. The new design provides an improved connectivity of the power transistors (via their respective source S, drain D and gate G) aiming at providing optimal performance of the switching operations of the power transistors. More specifically, the objective is to ensure uniform current sharing during the switching ON and OFF of the power transistors. For this purpose, an equivalent electromagnetic environment is created for each power transistor, so that each power transistor operates in the same conditions for the switching periods (more specifically, with similar parasitic leakage inductances).

Figure 5:
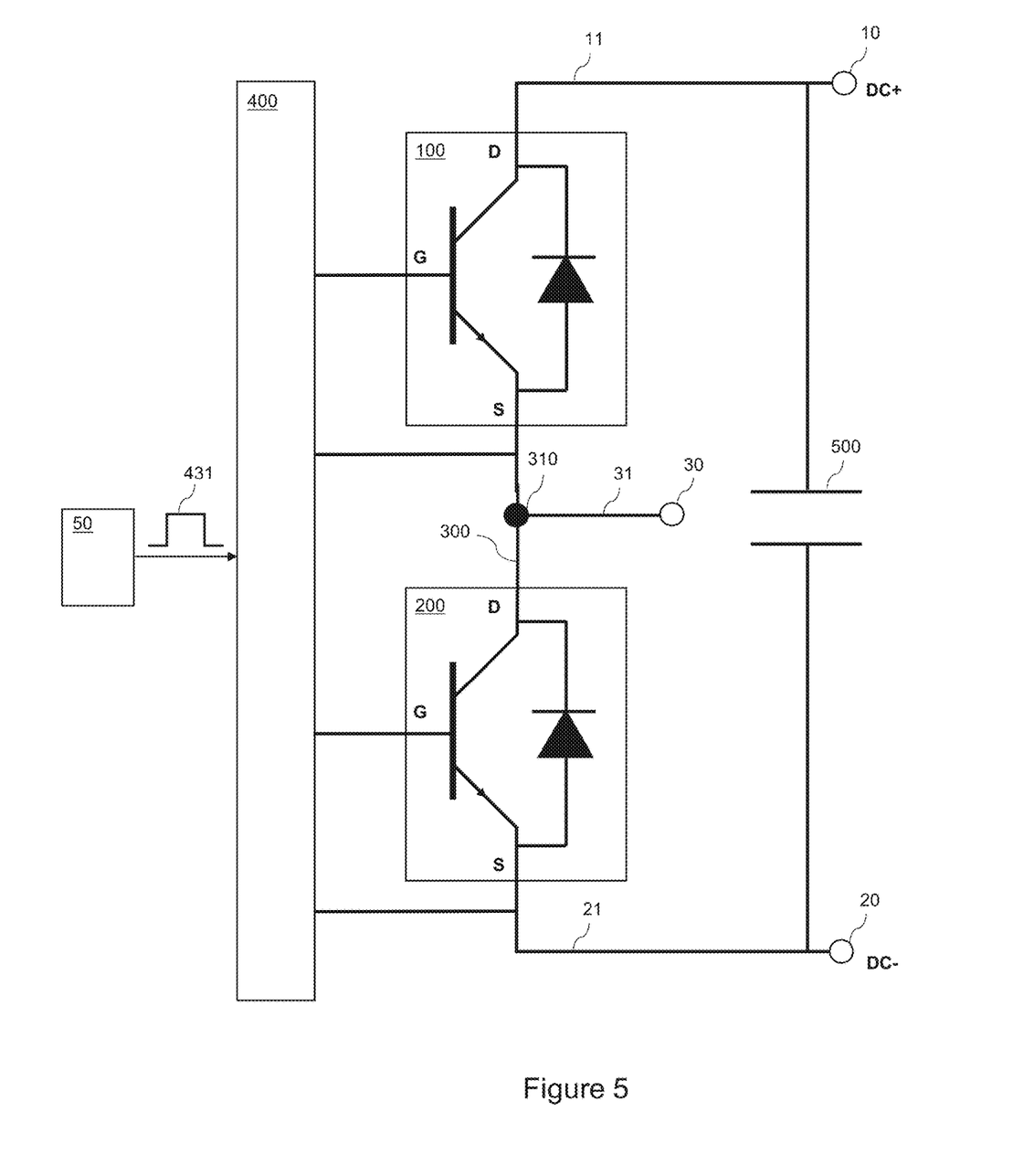
FIG. 5 represents another power switching cell comprising two power transistors in series.

Reference is now made concurrently to FIGS. 2 and 5, where FIG. 5 represents another power switching cell. The power switching cell represented in FIG. 5 is similar to the one represented in FIG. 2. The only difference is the introduction of a decoupling capacitor 500 in parallel with the transistor leg comprising the power transistors 100 and 200 in series.

The positive DC line 11 and the negative DC line 21 provision the decoupling capacitor 500 in electrical power (by accumulating electrical charges in the decoupling capacitor 500). An example of decoupling capacitor 500 adapted to the power switching cell is a Metallized Polypropylene capacitor. This type of capacitor presents good operating characteristics at high frequencies, which is well adapted to the switching dynamic of the power transistors 100 and 200. However, other types of high frequency capacitors adapted to the switching dynamic of the power transistors 100 and 200 may also be used.

Although a single decoupling capacitor 500 is represented in FIG. 5, a plurality of decoupling capacitors in parallel may be used for a given switching cell. The plurality of decoupling capacitors has respective different capacitance values resulting in a combined capacitance equivalent to the capacitance of a single decoupling capacitor. Therefore, functionally, the plurality of decoupling capacitors is equivalent to the single decoupling capacitor 500 illustrated in FIG. 5. The usage of the plurality of decoupling capacitors in parallel allows to control the high frequency characteristic of the switching cell.

Various types of power transistors (100 and 200) can be used for implementing the switching leg, including Insulated Gate Bipolar Transistor (IGBT) transistors, standard Silicon Metal-Oxide-Semiconductor (SiMOS) transistors, Silicon Carbide Metal-Oxide-Semiconductor (SiCMOS) transistors, Gallium Nitride (GaN) transistors, etc. The choice of the decoupling capacitor(s) of each switching cell depends on the type of power transistor being used.

The transistor leg (comprising the power transistors 100 and 200 in series) and its associated decoupling capacitor(s) 500 are placed as close as possible to one another, in order to minimize the parasitic elements influencing the switching dynamic of the power transistors 100 and 200.

Details of the implementation of the gate driver circuit 400 are not provided, because such gate driver circuits are well known in the art and the precise implementation of the gate driver circuit 400 is not within the scope of the present disclosure. An exemplary implementation has been detailed previously, in relation to FIG. 2. Furthermore, tables 1 and 2 describe the logic applied by the gate driver circuit 400 for controlling and synchronizing the power transistors 100 and 200 under its control.

A controller 50 generates and transmits the electrical control signal 431 for controlling the gate driver circuit 400. In a common implementation, the gate driver circuit 400 amplifies the electrical control signal 431 received from the controller 50. The gate driver circuit 400 generates (based on the amplified electrical control signal 431) the respective adequate electrical voltages applied to the respective gates G of each power transistor (100, 200). The gate driver circuit 400 also provides galvanic isolation between the power side (the power transistors 100 and 200) and the control side (the controller 50).

When a plurality of power switching cells are put in parallel as illustrated in FIGS. 3 and 4, the controller 50 controls and synchronizes each one of the plurality of power switching cells. For example, referring to FIG. 3, the controller 50 transmits the same electrical control signal 431 to the gate driver circuits 400 and 401, to apply the control logic illustrated in table 1 to the power transistors 100, 101, 200 and 201.

Figure 6:
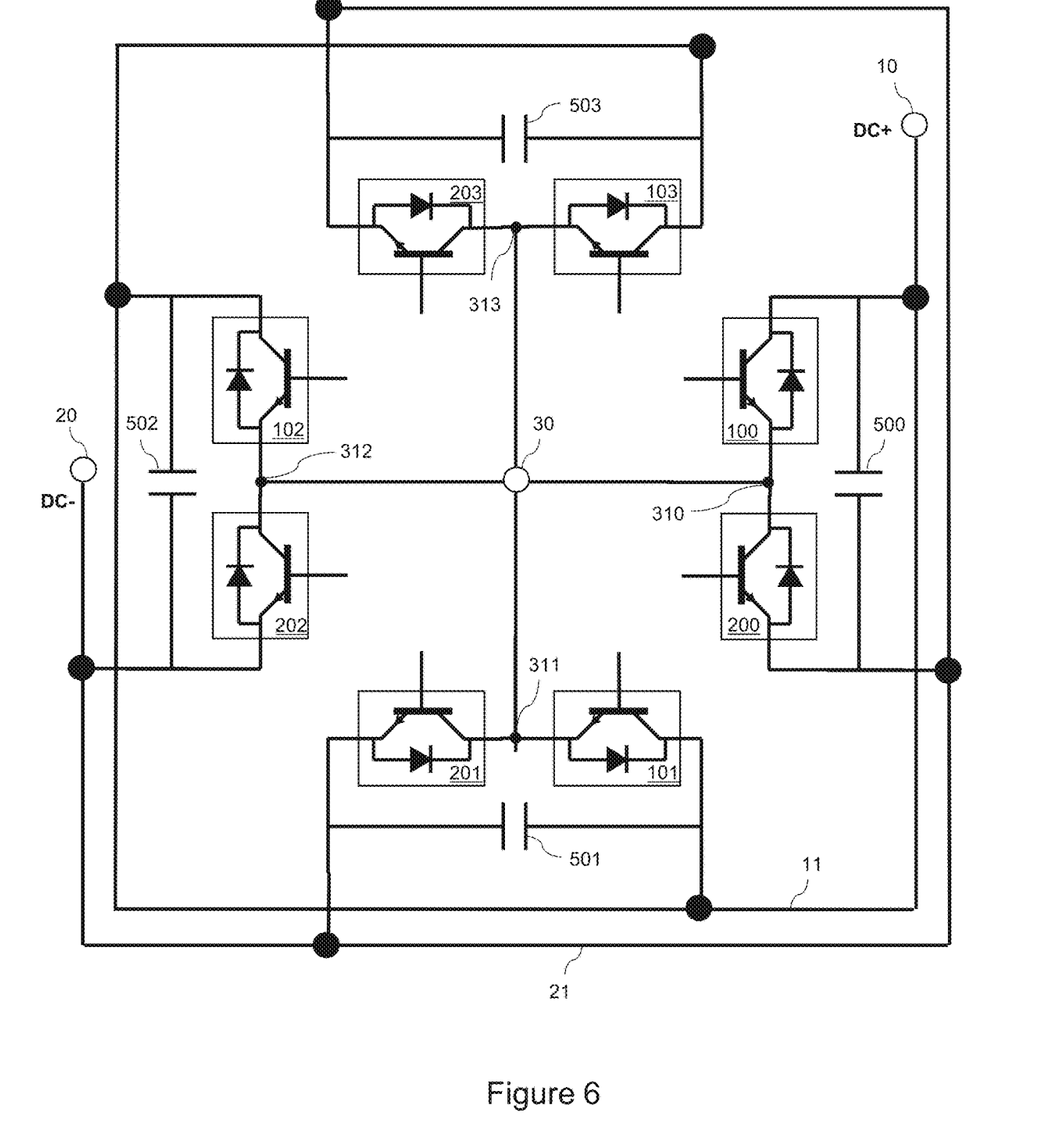
FIG. 6 represents a new design for integrating four power switching cells identical to the one illustrated in FIG. 5 in parallel.
Figure 7:
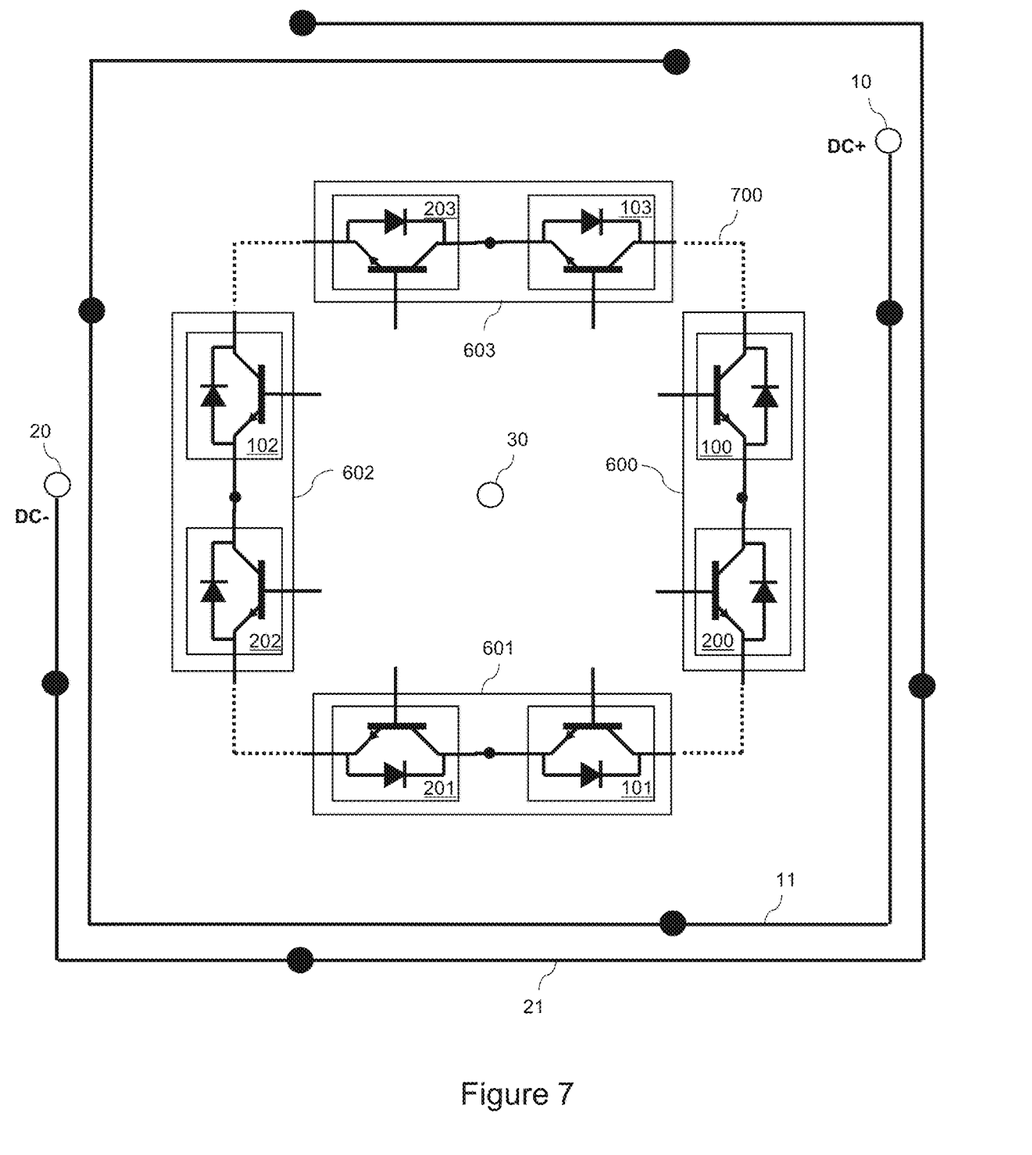
FIG. 7 is a simplified version of the new design represented in FIG. 6.

Reference is now made concurrently to FIGS. 5, 6 and 7, where FIGS. 6 and 7 represent a new design for integrating a plurality of power switching cells connected in parallel. The new design aims at integrating N power switching cells on a printed circuit board, where N is greater than 2 (at least 3).

Referring more particularly to FIGS. 5 and 6, four power switching cells are integrated on a printed circuit board (not represented in FIGS. 6 and 7 for simplification purposes) and connected in parallel. FIG. 7 is a simplified representation of FIG. 6.

A first power switching cell represented on FIG. 6 corresponds to the one represented in FIG. 5, and comprises the power transistors 100 and 200, the decoupling capacitor 500, and the connection middle-point 310.

A second power switching cell represented on FIG. 6 is similar to the one represented in FIG. 5, and comprises the power transistors 101 and 201, the decoupling capacitor 501, and the connection middle-point 311.

A third power switching cell represented on FIG. 6 is similar to the one represented in FIG. 5, and comprises the power transistors 102 and 202, the decoupling capacitor 502, and the connection middle-point 312.

A fourth power switching cell represented on FIG. 6 is similar to the one represented in FIG. 5, and comprises the power transistors 103 and 203, the decoupling capacitor 503, and the connection middle-point 313.

The other components of each power switching cell illustrated in FIG. 5 are not represented in FIG. 6 for simplification purposes. However, each power switching cell represented in FIG. 6 comprises these other components. In particular, each power switching cell of FIG. 6 comprises a gate driver circuit (not represented in FIG. 6 for simplification purposes) similar to the gate driver circuit 400 illustrated in FIG. 5.

Each power switching cell represented in FIG. 6 comprises a transistor leg including two power transistors in series. The first transistor leg 600 (illustrated in FIG. 7) comprises the power transistors 100 and 200 connected in series. The second transistor leg 601 (illustrated in FIG. 7) comprises the power transistors 101 and 201 connected in series. The third transistor leg 602 (illustrated in FIG. 7) comprises the power transistors 102 and 202 connected in series. The fourth transistor leg 603 (illustrated in FIG. 7) comprises the power transistors 103 and 203 connected in series. The four transistor legs are integrated to the printed circuit board in the same layer.

A person skilled in the art would readily adapt table 2 (by including the power transistors 103 and 203) to describe the logic applied by the four gate driver circuits for controlling and synchronizing the serialized pairs of power transistors of the corresponding four transistor legs.

As mentioned previously, the integration of the four gate driver circuits to the printed circuit board may vary. In a first implementation, the four gate driver circuits are integrated in the same layer as the four transistor legs. In another implementation, the four gate driver circuits are not integrated in the same layer as the four transistor legs (e.g. they are positioned above the layer comprising the four transistor legs).

The drain D of the power transistors 100, 101, 102 and 103 are connected to the electrical direct current (DC) terminal 10 via the positive DC line 11. The source S of the power transistors 200, 201, 202 and 203 are connected to the electrical direct current (DC) terminal 20 via the negative DC line 21. As mentioned previously, the terminal 10 receives a positive electrical voltage DC+ and the terminal 20 receives a negative electrical voltage DC− from a DC power source not represented in FIG. 6 for simplification purposes. The voltage values DC+ and DC− generally consist in high voltages provided by the DC power source (e.g. at least 100 volts DC voltage).

As mentioned previously, for each transistor leg (respectively 600, 601, 602 and 603) comprising a first power transistor (respectively 100, 101, 102 and 103) in series with a second power transistor (respectively 200, 201, 202 and 203), the source S of the first power transistor is connected to the drain D of the second power transistor via a line comprising a connection middle-point (respectively 310, 311, 312 and 313). The connection middle-points 310, 311, 312 and 313 are connected to the output terminal 30 via output lines. Although not represented in FIG. 6 for simplification purposes, the output terminal 30 is connected to an inductive load (e.g. an electrical device, a DC-DC converter, etc.) powered by the printed circuit board embedding the four transistor legs.

Referring more specifically to FIG. 7, a square 700 is represented in FIG. 7. Each one of the transistor legs 600, 601, 602 and 603 (of the corresponding four switching cells) is positioned along one of the four edges of the square 700.

This design can be generalized to a printed circuit board embedding N switching cells respectively comprising a transistor leg per switching cell, N being greater than 2 (at least 3). The N transistor legs of the corresponding N switching cells are positioned on the printed circuit board to substantially form a convex polygon having N edges, the N edges having substantially the same length. Each one of the N transistor legs of the corresponding N switching cells is positioned along one of the edges of the convex polygon.

Furthermore, the output terminal 30 is positioned substantially at the center of the polygon formed by the N transistor legs of the corresponding N switching cells. For instance, as illustrated in FIG. 7, the output terminal 30 is positioned at the center of the square 700.

Figure 8:
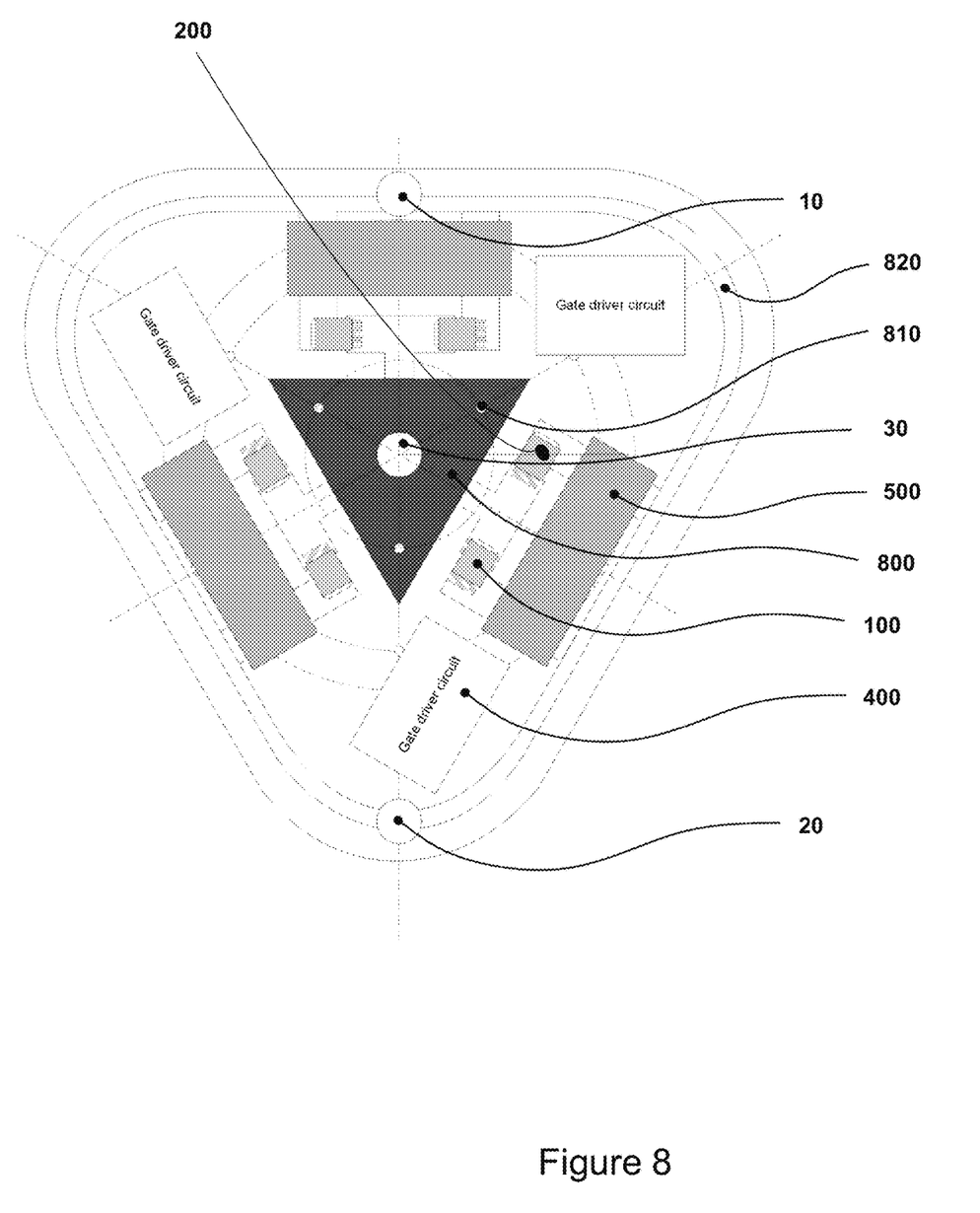
FIG. 8 represents a printed circuit board integrating three power switching cells identical to the one illustrated in FIG. 5 in parallel.
Figure 9:
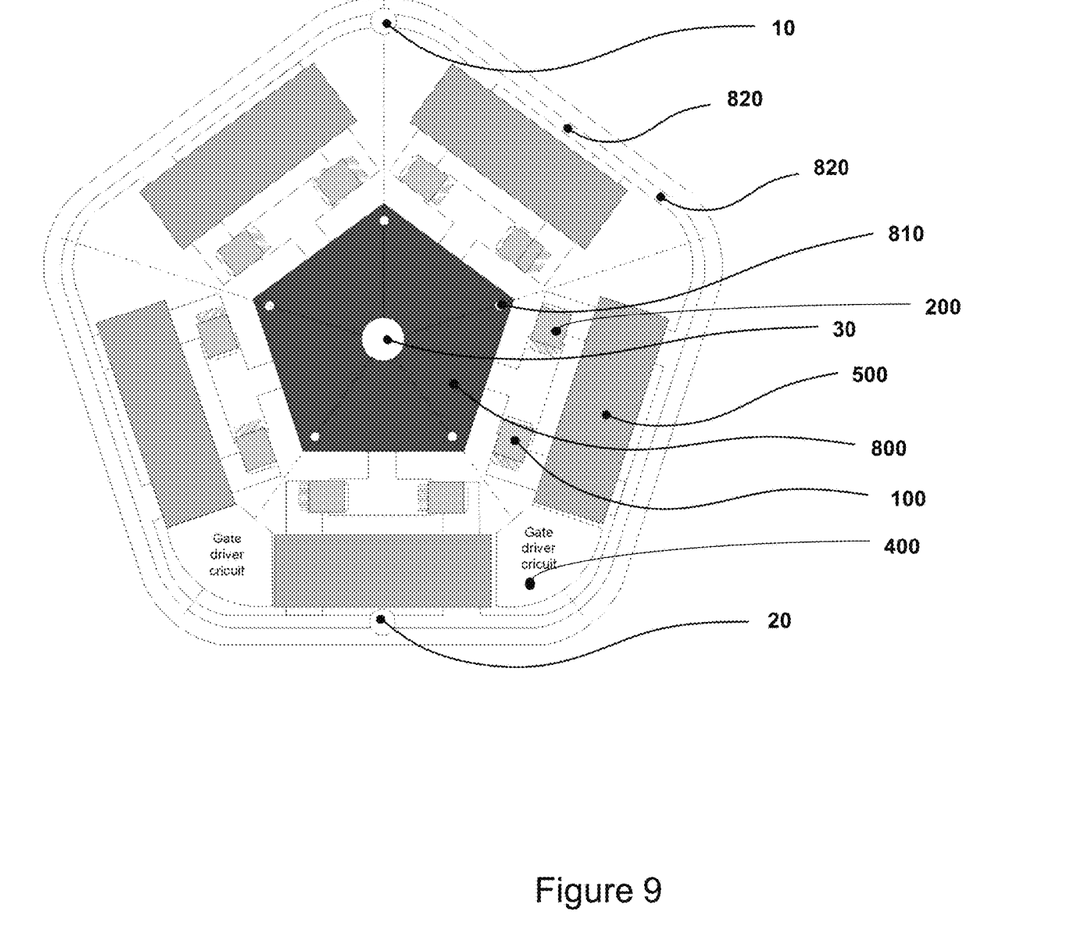
FIG. 9 represents a printed circuit board integrating five power switching cells identical to the one illustrated in FIG. 5 in parallel.

For example, FIG. 8 illustrates a printed circuit board embedding three transistor legs. Each one of the three transistor legs is positioned along one of the edges of an equilateral triangle. The output terminal 30 is positioned at the center of the equilateral triangle. FIG. 9 illustrates a printed circuit board embedding five transistor legs. Each one of the five transistor legs is positioned along one of the edges of a convex pentagon, the five edges of the pentagon having the same size. The output terminal 30 is positioned at the center of the pentagon.

Referring back to FIG. 7, the positive DC line 11 and the negative DC line 21 encircle the transistor legs 600, 601, 602 and 603. This design can be generalized to a printed circuit board embedding N transistor legs, where the positive DC line 11 and the negative DC line 21 encircle the N transistor legs.

The respective positions of the N transistor legs with respect to one another, as well as with respect to the positive DC line 11 and the negative DC line 21, ensure that each power transistor is positioned at substantially the same distance from the positive DC line 11 and the negative DC line 21.

To further improve the switching characteristics of the N transistor legs, the positive DC line 11 and the negative DC line 21 are stacked to form a structure usually referred to as a laminated DC bus. For example, the laminated DC bus comprises the positive DC line 11 positioned above the negative DC line 21. Alternatively, the laminated DC bus comprises the negative DC line 21 positioned above the positive DC line 11.

The advantages of using a laminated DC bus are well known in the art. In particular, a laminated DC bus reduces leakage inductance, which in turn reduces voltage spikes created by the leakage inductance when the power transistors are switched OFF.

As mentioned previously, the laminated DC bus encircles the N transistor legs. By using this geometry, each switching cell comprising a transistor leg has the same equivalent impedance to the laminated DC bus (a low impedance laminated DC bus is available for each switching cell).

The decoupling capacitors (e.g. 500, 501, 502 and 503 in FIG. 6) of the switching cells are supplied by the laminated DC bus. Furthermore, the decoupling capacitors are evenly distributed on the printed circuit board (as illustrated in FIGS. 8 and 9), resulting in an evenly distributed supply of current to the decoupling capacitors and constant electromagnetic conditions (more specifically leakage inductances) for the switching cells. As mentioned previously, several decoupling capacitors in parallel can be used (instead of a single decoupling capacitor) for each switching cell, to improve the frequency response of this decoupling.

By using the aforementioned symmetrical approach in the positioning of the various components on the printed circuit board, the switching cells are substantially identical, with the effect that each transistor leg switches substantially in the same conditions. By ensuring these constant conditions for all the switching cells, the current sharing similarities for each transistor leg are optimized, resulting in uniform current sharing between the power transistors of the different transistor legs.

Referring to FIG. 8, an exemplary design of a printed circuit board embedding three transistor legs (of three corresponding switching cells) is illustrated, where each one of the three transistor legs (of the three corresponding switching cells) is positioned along one of the edges of an equilateral triangle. Each transistor leg includes two power transistors in series (only power transistors 100 and 200 are identified in FIG. 8 for simplification purposes). Three decoupling capacitors 500 respectively associated to the three transistor legs are represented. Three gate driver circuits 400 respectively associated to the three transistor legs are represented. Two DC input terminals (one positive 10 and one negative 20) and one output terminal 30 are represented. The respective positions of the positive 10 and negative 20 DC input terminals can be switched. A DC power ring 820 comprising a positive DC line connected to the positive DC input terminal 10 and a negative DC line connected to the negative DC input terminal 20 is represented.

The printed circuit board further comprises a fiberglass insulator 800 positioned at the center of the printed circuit board. The fiberglass insulator 800 is made of fiberglass-epoxy laminate material. The output terminal 30 is supported by the fiberglass insulator 800. Fiberglass-epoxy laminate material is a rigid material commonly used for high voltage applications, which provides a strong support for the output terminal 30 and also has the property of providing insulation. In the case where a heatsink (not represented in FIG. 8) is positioned below the printed circuit board, the fiberglass insulator 800 adds some pressure on the printed circuit board, to improve thermal transfer from the printed circuit board to the heatsink.

The printed circuit board further comprises a plurality of mounting holes 810 evenly distributed on the printed circuit board, the mounting holes 810 receiving screws (not represented in FIG. 8) for securing the printed circuit board to the heatsink located below the printed circuit board. The plurality of mounting holes 810 is used to apply an adequate pressure on the printed circuit board, to adequately transfer heat dissipated by the power transistors to the heatsink.

A common design is to have a thermal pad positioned between the printed circuit board and the heat sink. A thermal resistance of the thermal pad depends on a pressure applied by the printed circuit board on the thermal pad.

The screws inserted in the mounting holes 810 need to be tightened with a well-defined torque. If the pressure applied to the printed circuit board is too low, the heat transfer is poor and the current capability (at the output terminal 30) provided by the printed circuit board decreases. If the pressure applied to the printed circuit board is not uniform, the junction temperature of power transistors (e.g. 100 and 200) may vary from one transistor to another, resulting in poor paralleling of the transistor legs.

In the case where a fiberglass insulator 800 is integrated to the printed circuit board, the plurality of mounting holes 810 is collocated with the fiberglass insulator 800, as illustrated in FIG. 8.

Referring to FIG. 9, an exemplary design of a printed circuit board embedding five transistor legs (of five corresponding switching cells) is illustrated, where each one of the five transistor legs (of the five corresponding switching cells) is positioned along one of the edges of a convex pentagon. The five edges of the pentagon have the same size. Each transistor leg includes two power transistors in series (only power transistors 100 and 200 are identified in FIG. 9 for simplification purposes). Five decoupling capacitors 500 respectively associated to the five transistor legs are represented. Five gate driver circuits 400 respectively associated to the five transistor legs are represented. Two DC input terminals (one positive 10 and one negative 20) and one output terminal 30 are represented. The respective positions of the positive 10 and negative 20 DC input terminals can be switched. A DC power ring 820 comprising a positive DC line connected to the positive DC input terminal 10 and a negative DC line connected to the negative DC input terminal 20 is represented.

The printed circuit board further comprises the fiberglass insulator 800 and the plurality of evenly distributed mounting holes 810 previously mentioned in relation to FIG. 8.

The present disclosure is not limited to transistor legs comprising power transistors in series, but can be generalized to transistor legs comprising any type of transistors in series.

Although the present disclosure has been described hereinabove by way of non-restrictive, illustrative embodiments thereof, these embodiments may be modified at will within the scope of the appended claims without departing from the spirit and nature of the present disclosure.

What is claimed is:

1. A printed circuit board comprising:
    a pair of input terminals consisting of a positive direct current (DC) terminal and a negative DC terminal;
    an output terminal;
    a positive DC line connected to the positive DC terminal;
    a negative DC line connected to the negative DC terminal;
    N power switching cells, N being an integer greater than two, the N power switching cells operating in parallel, each power switching cell comprising:
        a transistor leg comprising a first transistor and a second transistor connected in series, a drain of the first transistor being connected to the positive DC line, a source of the second transistor being connected to the negative DC line, a source of the first transistor being connected to a drain of the second transistor via an electrical line comprising a connection middle-point, the connection middle-point being connected to the output terminal;
        at least one decoupling capacitor in parallel with the transistor leg; and
        a gate driver circuit comprising a first gate driver electrically connected to a gate of the first transistor and a second gate driver electrically connected to a gate of the second transistor for controlling respective switching ON and OFF of the first and second transistors; and
    wherein the N transistor legs of the corresponding N power switching cells are positioned on the printed circuit board to substantially form a convex polygon having N edges of substantially the same length, each one of the N transistor legs of the corresponding N power switching cells being positioned along one of the edges of the convex polygon.

2. The printed circuit board of claim 1, wherein the output terminal is positioned substantially at the center of the convex polygon formed by the N transistor legs of the corresponding N power switching cells.

3. The printed circuit board of claim 1, wherein the positive and negative DC lines are positioned on the printed circuit board to encircle the N transistor legs of the corresponding N power switching cells.

4. The printed circuit board of claim 1, wherein one of the positive or negative DC lines is stacked above the other one to form a laminated DC bus.

5. The printed circuit board of claim 1, wherein the at least one decoupling capacitor of the N power switching cells are evenly distributed on the printed circuit board.

6. The printed circuit board of claim 1, wherein a fiberglass insulator is positioned at the center of the printed circuit board, the output terminal being supported by the fiberglass insulator.

7. The printed circuit board of claim 1, comprising a plurality of mounting holes evenly distributed on the printed circuit board, the mounting holes receiving screws for securing the printed circuit board to a heatsink located below the printed circuit board.

8. The printed circuit board of claim 1, wherein the first and second transistors consist of power transistors.

9. The printed circuit board of claim 8, wherein the first and second power transistors consist of Insulated Gate Bipolar Transistor (IGBT) transistors, Silicon Metal-Oxide-Semiconductor (SiMOS) transistors, Silicon Carbide Metal-Oxide-Semiconductor (SiCMOS) transistors or Gallium Nitride (GaN) transistors.

10. The printed circuit board of claim 1, wherein the N gate driver circuits synchronously switch ON the N first transistors and switch OFF the N second transistors.

11. The printed circuit board of claim 1, wherein the N gate driver circuits synchronously switch OFF the N first transistors and switch ON the N second transistors.

12. The printed circuit board of claim 1, wherein the at least one decoupling capacitor consists of a high frequency capacitor.

13. The printed circuit board of claim 1, wherein the positive and negative DC lines provision the at least one decoupling capacitor of each power switching cell in current.

14. The printed circuit board of claim 1, wherein the N gate driver circuits are connected to a controller generating an electrical control signal for synchronizing the N first and second transistors, the electrical control signal being amplified by the N gate driver circuits.

15. The printed circuit board of claim 1, wherein the N gate driver circuits are positioned on the printed circuit board in a same layer as the N transistor legs.

16. The printed circuit board of claim 1, wherein the N gate driver circuits are positioned on the printed circuit board above a layer comprising the N transistor legs.

17. The printed circuit board of claim 1, wherein N is equal to 3 and the 3 transistor legs are positioned on the printed circuit board to substantially form an equilateral triangle.

18. The printed circuit board of claim 1, wherein N is equal to 5 and the 5 transistor legs are positioned on the printed circuit board to substantially form a convex pentagon, the five edges of the pentagon having the same size.

19. The printed circuit board of claim 1, wherein the output terminal is connected to an inductive load.

20. The printed circuit board of claim 1, wherein the input terminals are connected to a DC power source providing a high voltage direct current of at least 100 volts.

* * * * *